(12) United States Patent
Takeshita et al.

(10) Patent No.: US 9,443,716 B2
(45) Date of Patent: Sep. 13, 2016

(54) PRECISE CRITICAL DIMENSION CONTROL USING BILAYER ALD

(71) Applicant: Applied Materials, Inc., Santa Clara, CA (US)

(72) Inventors: Kenji Takeshita, Sunnyvale, CA (US);
Nobuhiro Sakamoto, Tokyo (JP);
Yoshihiro Takenaga, Yokkaichi (JP);
Li-Qun Xia, Cupertino, CA (US);
Mandyam Sriram, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/878,576

(22) Filed: Oct. 8, 2015

(65) Prior Publication Data

US 2016/0104613 A1 Apr. 14, 2016

Related U.S. Application Data

(60) Provisional application No. 62/061,677, filed on Oct. 8, 2014.

(51) Int. Cl.
*H01L 21/02* (2006.01)
*H01L 21/027* (2006.01)
*H01L 21/311* (2006.01)

(52) U.S. Cl.
CPC ..... *H01L 21/02271* (2013.01); *H01L 21/0273* (2013.01); *H01L 21/02164* (2013.01); *H01L 21/31116* (2013.01); *H01L 21/31144* (2013.01)

(58) Field of Classification Search
CPC .............. H01L 21/02271; H01L 21/0273; H01L 21/31116; H01L 21/31144; H01L 21/02164
See application file for complete search history.

(56) References Cited

U.S. PATENT DOCUMENTS

| 8,492,282 | B2 | 7/2013 | DeVilliers | |
|---|---|---|---|---|
| 2004/0058293 | A1 | 3/2004 | Nguyen et al. | |
| 2006/0281266 | A1* | 12/2006 | Wells | H01L 21/0337 438/299 |
| 2009/0239382 | A1* | 9/2009 | Zhu | H01L 21/0337 438/696 |
| 2010/0130016 | A1* | 5/2010 | DeVilliers | H01L 21/0273 438/703 |
| 2010/0255218 | A1* | 10/2010 | Oka | C23C 16/402 427/579 |
| 2011/0217838 | A1* | 9/2011 | Hsieh | H01L 21/768 438/618 |
| 2012/0164846 | A1* | 6/2012 | Ha | H01L 21/02153 438/786 |
| 2013/0210238 | A1* | 8/2013 | Yudovsky | H01L 21/02104 438/758 |
| 2016/0027659 | A1* | 1/2016 | Hong | H01L 21/31144 257/774 |
| 2016/0062232 | A1* | 3/2016 | Hong | G03F 7/0035 430/325 |

OTHER PUBLICATIONS

PCT International Search Report and Written Opinion in PCT/US2015/054709, dated Dec. 28, 2015, 10 pages.

* cited by examiner

*Primary Examiner* — Minh-Loan Tran
*Assistant Examiner* — Farid Khan
(74) *Attorney, Agent, or Firm* — Servilla Whitney LLC

(57) ABSTRACT

Methods for self-aligned multiple patterning including controlled slimming of features during spacer layer deposition. Multiple spacer layer deposition process conditions produce a balance between controlling the damage to the features and increasing production throughput.

20 Claims, 10 Drawing Sheets

PRECISE CRITICAL DIMENSION CONTROL USING BILAYER ALD

CROSS-REFERENCE TO RELATED APPLICATIONS

This application claims priority to U.S. Provisional Application No. 62/061,677, filed Oct. 8, 2014, the entire contents of which are hereby incorporated by reference herein.

FIELD

Embodiments of the present disclosure generally relate to methods for performing sidewall spacer formation using plasma enhanced atomic layer deposition (PE ALD) films in self-aligned multiple patterning (SAMP). More particularly, embodiments of the disclosure are directed to methods for performing a critical dimension (CD) control process, a precise Mandrel layer damage control process and a bilayer ALD development process.

BACKGROUND

The critical dimension varies with magnitude of damage/stress on the mandrel film (typically an organic film) during PE ALD processing in self-aligned multiple patterning. The CD directly impacts on device yield and managing the damage to the mandrel can help increase control of the CD into a predetermined range. In conventional ALD processing, process parameters, such as RF power and pressure, are optimized and fixed for damage in a certain range to obtain the acceptable CD performance. However, there is a risk that chamber to chamber matching will be poor because there is no variable knob in recipe structure.

Another requirement for spacer formation process in SAMP is a CD slimming capability to buffer wafer to wafer variation generated by earlier processing, such as lithography. The oxygen plasma in the same ALD chamber is typically used to slim the mandrel CD. The oxygen plasma slimming prior to deposition process, however, affects the overall productivity such as throughput and defect performance.

Accordingly, there is an ongoing need in the art for methods of controlling the critical dimension in self-aligned multiple patterning processes.

SUMMARY

Embodiments of the disclosure are directed to processing methods. The methods comprise providing a substrate having a photoresist with features thereon. Each of the features has a top, sidewalls and a width. Up to about ten layers of a spacer film are deposited using a first process condition to decrease the width of the photoresist features. Additional spacer film is deposited using a second process condition to form a spacer film having a total thickness less than about 50 nm. The spacer film is etched from the top surface of the photoresist features while leaving the spacer film on the sidewalls of the features. The photoresist is removed to leave the spacer film from the sidewalls of the features and to expose portions of the substrate. The exposed portions of the substrate are etched to form adjacent pairs of substrate features.

Additional embodiments of the disclosure are directed to processing methods. The methods comprise providing a substrate with a patterned photoresist thereon. The photoresist comprises a plurality of photoresist features with each photoresist feature having at least one sidewall, a top and a width. A first layer of a spacer film is deposited by sequential exposure of the photoresist to a first precursor and a first plasma. Each exposure to the first plasma occurs under a first process condition. Depositing the first layer results in a decrease in the width of the plurality of photoresist features. A second layer of a spacer film is deposited by sequential exposure of the photoresist to a second precursor and a second plasma to form a spacer film. Each exposure to the second plasma occurs under a second process condition which is different from the first process condition. Depositing the second layer results in substantially no change in the width of the photoresist features. The spacer film is etched to remove substantially all of the spacer film from the top of the photoresist features without removing substantially any of the spacer film from the sidewalls of the photoresist features. The patterned photoresist is removed to expose the substrate beneath the photoresist features and leave the spacer film from the sidewalls of the photoresist features. The exposed substrate is etched to form adjacent pairs of first features comprising the substrate material. The adjacent pairs of first features have adjacent critical dimensions and pair critical dimensions.

Further embodiments of the disclosure are directed to processing methods comprising positioning a substrate having a photoresist with photoresist features thereon in a processing chamber. Each of the photoresist features has a top, sidewalls and a width. Up to about ten PE ALD layers of a spacer film are deposited. Each layer is deposited by a first PE ALD process to decrease the width of the photoresist features. The first PE ALD process comprising exposing the substrate to a first process gas in a first processing region of the processing chamber, where the first process gas comprising a silicon precursor; laterally moving the substrate through a gas curtain to a second process region in the processing chamber; exposing the substrate to a second process gas in the second process region for a first exposure time, where the second process gas comprising a plasma. Additional spacer film is deposited by repeating a second PE ALD process to form a spacer film having a total thickness in the range of about 10 nm to about 50 nm. The second PE ALD process comprising exposing the substrate to a third process gas in a third processing region, where the third process gas comprising a silicon precursor; laterally moving the substrate through a gas curtain to a fourth process region in the processing chamber; exposing the substrate to a fourth process gas in the fourth process region for a second exposure time, where the second process gas comprising a plasma and the second exposure time is shorter than the first exposure time. The spacer film is etched to remove substantially all of the spacer film from the top of the photoresist features without removing substantially any of the spacer film from the sidewalls of the photoresist features. The patterned photoresist is removed to expose the substrate beneath the photoresist features and leave the spacer film from the sidewalls of the photoresist features. The exposed substrate is etched to form adjacent pairs of first features comprising the substrate material. The adjacent pairs of first features have adjacent critical dimensions and pair critical dimensions. The first features have a top, sidewalls and a width.

BRIEF DESCRIPTION OF THE DRAWINGS

So that the manner in which the above recited features of the present invention can be understood in detail, a more particular description of the disclosure, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
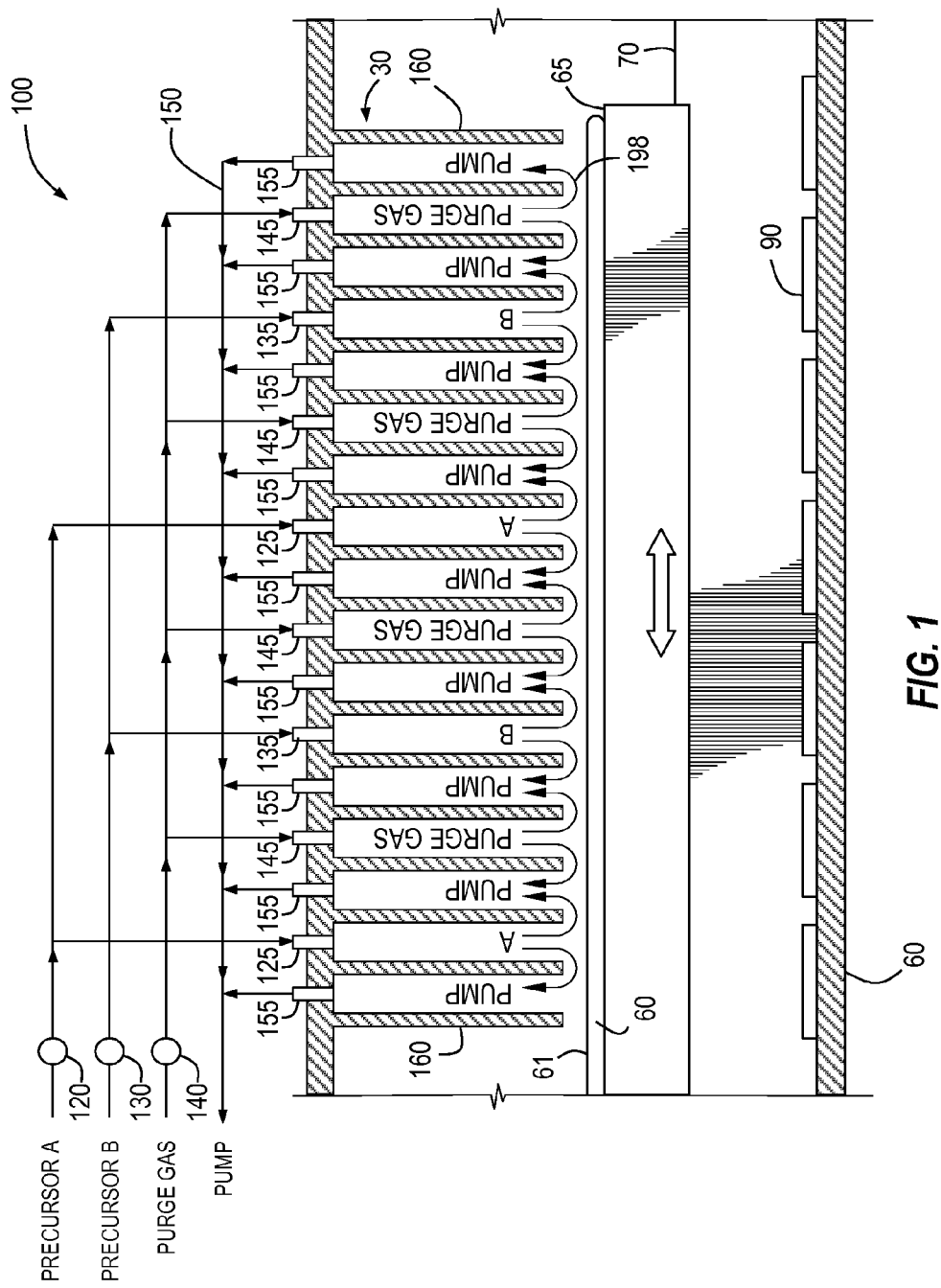
FIG. 1 is a cross-sectional side view of a spatial atomic layer deposition chamber in accordance with one or more embodiment of the disclosure.

Some embodiments of the disclosure provide method of controlling the critical dimension in self-aligned multiple patterning processes. In ALD processing, the first few layer cycles determine the Mandrel damage which can impact on the critical dimension. The inventors have found that separating the initiation layer deposition from the bulk deposition can advantageously control the damage on the Mandrel. One or more embodiments allow control of the critical dimension (CD) with the damage to the Mandre. In some embodiments, the bilayer ALD process advantageously provides control of the damage to the Mandrel and the CD, as well as, improving the film quality and productivity.

As used in this specification and the appended claims, the terms "reactive gas", "precursor", "reactant", and the like, are used interchangeably to mean a gas that includes a species which is reactive in an atomic layer deposition process. For example, a first "reactive gas" may simply adsorb onto the surface of a substrate and be available for further chemical reaction with a second reactive gas.

Some embodiments of the disclosure are directed to processing methods in which a number of layers of a spacer film are deposited onto the features of a photoresist. The deposition of up to about 10 layers by ALD results in a decrease in the width of the photoresist features so that further deposition of the spacer film can be performed without additional damage to the feature. The two-step approach can advantageously allow for more rapid deposition of the spacer film while controlling the amount of feature slimming.

The deposition of the spacer film is typically done by ALD, but could be a CVD reaction. A traditional time-domain ALD process occurs where the substrate is exposed to a first process gas followed by purging of the processing chamber and then exposure to a second processing gas. The second processing gas of some embodiments is a plasma that can result in controlled damage to the features.

Another type of deposition process that can be used with embodiments of the disclosure is spatial atomic layer deposition. A spatial ALD processing chamber, also referred to as a batch processing chamber, is described herein with reference to the Figures. Those skilled in the art will understand that the processing method in accordance with various embodiments of the disclosure can be performed in a traditional time-domain ALD process or a spatial ALD process and the claims should not be limited to spatial ALD.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. For example, in spatially separated ALD, described with respect to FIG. 1, each precursor is delivered to the substrate, but any individual precursor stream, at any given time, is only delivered to a portion of the substrate. Additionally, reference to depositing on a substrate can mean both a bare substrate and a substrate with one or more films or features deposited or formed thereon.

FIG. 1 is a schematic cross-sectional view of a portion of a processing chamber 20 in accordance with one or more embodiments of the disclosure. The processing chamber 20 is generally a sealable enclosure, which is operated under vacuum or at least low pressure conditions. The chamber 100 includes a gas distribution assembly 30 capable of distributing one or more gases across the top surface 61 of a substrate 60. The gas distribution assembly 30 can be any suitable assembly known to those skilled in the art, and specific gas distribution assemblies described should not be taken as limiting the scope of the disclosure. The output face of the gas distribution assembly 30 faces the first surface 61 of the substrate 60.

Substrates for use with the embodiments of the disclosure can be any suitable substrate. In some embodiments, the substrate is a rigid, discrete, generally planar substrate. As used in this specification and the appended claims, the term "discrete" when referring to a substrate means that the substrate has a fixed dimension. The substrate of one or more embodiments is a semiconductor substrate, such as a 200 mm or 300 mm diameter silicon substrate. In some embodiments, the substrate is one or more of silicon, silicon germanium, gallium arsenide, gallium nitride, germanium, gallium phosphide, indium phosphide, sapphire and silicon carbide.

The gas distribution assembly 30 comprises a plurality of gas ports to transmit one or more gas streams to the substrate 60 and a plurality of vacuum ports disposed between each gas port to transmit the gas streams out of the processing chamber 20. In the embodiment of FIG. 1, the gas distribution assembly 30 comprises a first precursor injector 120, a second precursor injector 130 and a purge gas injector 140. The injectors 120, 130, 140 may be controlled by a system computer (not shown), such as a mainframe, or by a chamber-specific controller, such as a programmable logic controller. The precursor injector 120 injects a continuous (or pulse) stream of a reactive precursor of compound A into the processing chamber 20 through a plurality of gas ports 125. The precursor injector 130 injects a continuous (or pulse) stream of a reactive precursor of compound B into the processing chamber 20 through a plurality of gas ports 135. The purge gas injector 140 injects a continuous (or pulse) stream of a non-reactive or purge gas into the processing chamber 20 through a plurality of gas ports 145. The purge gas removes reactive material and reactive by-products from the processing chamber 20. The purge gas is typically an inert gas, such as, nitrogen, argon and helium. Gas ports 145 are disposed in between gas ports 125 and gas ports 135 so as to separate the precursor of compound A from the precursor of compound B, avoiding cross-contamination between the precursors.

In another aspect, a remote plasma source (not shown) may be connected to the precursor injector 120 and the precursor injector 130 prior to injecting the precursors into the processing chamber 20. The plasma of reactive species may be generated by applying an electric field to a compound within the remote plasma source. Any power source that is capable of activating the intended compounds may be used. For example, power sources using DC, radio frequency (RF), and microwave (MW) based discharge techniques may be used. If an RF power source is used, it can be either capacitively or inductively coupled. The activation may also be generated by a thermally based technique, a gas breakdown technique, a high energy light source (e.g., UV energy), or exposure to an x-ray source. Exemplary remote plasma sources are available from vendors such as MKS Instruments, Inc. and Advanced Energy Industries, Inc.

The chamber 100 further includes a pumping system 150 connected to the processing chamber 20. The pumping system 150 is generally configured to evacuate the gas streams out of the processing chamber 20 through one or more vacuum ports 155. The vacuum ports 155 are disposed between each gas port so as to evacuate the gas streams out of the processing chamber 20 after the gas streams react with the substrate surface and to further limit cross-contamination between the precursors.

The chamber 100 includes a plurality of partitions 160 disposed on the processing chamber 20 between each port. A lower portion of each partition extends close to the first surface 61 of substrate 60, for example, about 0.5 mm or greater from the first surface 61. In this manner, the lower portions of the partitions 160 are separated from the substrate surface by a distance sufficient to allow the gas streams to flow around the lower portions toward the vacuum ports 155 after the gas streams react with the substrate surface. Arrows 198 indicate the direction of the gas streams. Since the partitions 160 operate as a physical barrier to the gas streams, they also limit cross-contamination between the precursors. The arrangement shown is merely illustrative and should not be taken as limiting the scope of the disclosure. It will be understood by those skilled in the art that the gas distribution system shown is merely one possible distribution system and the other types of showerheads and gas distribution assemblies may be employed.

Figure 3:
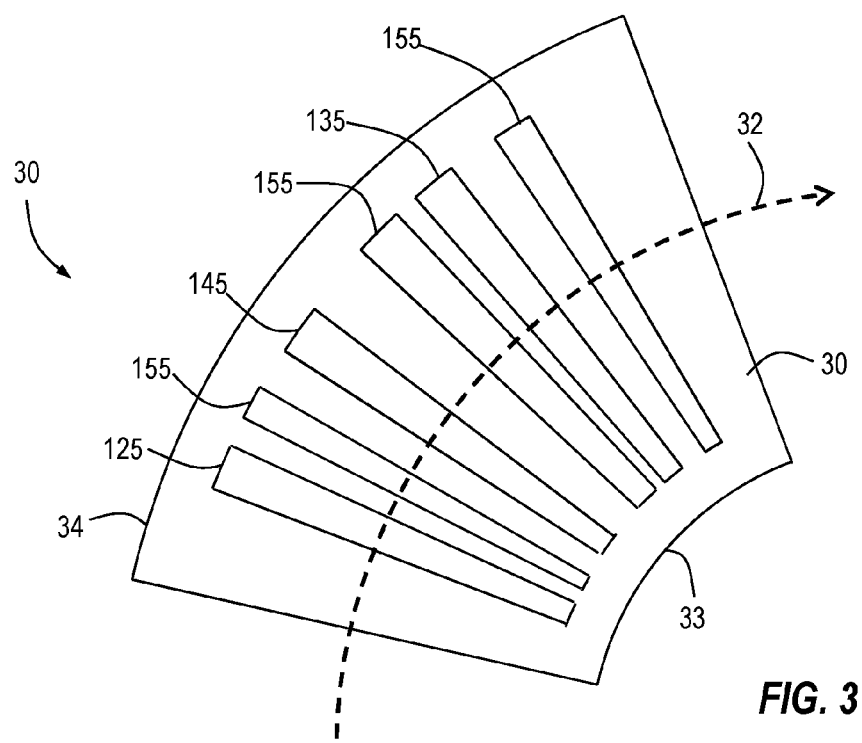
FIG. 3 shows a schematic of a pie-shaped gas distribution assembly in accordance with one or more embodiments of the disclosure.

Atomic layer deposition systems of this sort (i.e., where multiple gases are separately flowed toward the substrate at the same time) are referred to as spatial ALD. In operation, a substrate 60 is delivered (e.g., by a robot) to the processing chamber 20 and can be placed on a shuttle 65 before or after entry into the processing chamber. The shuttle 65 is moved along the track 70, or some other suitable movement mechanism, through the processing chamber 20, passing beneath (or above) the gas distribution assembly 30. In the embodiment shown in FIG. 1, the shuttle 65 is moved in a linear path through the chamber. FIG. 3, as explained further below, shows an embodiment in which wafers are moved in a circular path through a carousel processing system.

Referring back to FIG. 1, as the substrate 60 moves through the processing chamber 20, the first surface 61 of substrate 60 is repeatedly exposed to the reactive gas A coming from gas ports 125 and reactive gas B coming from gas ports 135, with the purge gas coming from gas ports 145 in between. Injection of the purge gas is designed to remove unreacted material from the previous precursor prior to exposing the substrate surface 110 to the next precursor. After each exposure to the various gas streams (e.g., the reactive gases or the purge gas), the gas streams are evacuated through the vacuum ports 155 by the pumping system 150. Since a vacuum port may be disposed on both sides of each gas port, the gas streams are evacuated through the vacuum ports 155 on both sides. Thus, the gas streams flow from the respective gas ports vertically downward toward the first surface 61 of the substrate 60, across the substrate surface 110 and around the lower portions of the partitions 160, and finally upward toward the vacuum ports 155. In this manner, each gas may be uniformly distributed across the substrate surface 110. Arrows 198 indicate the direction of the gas flow. Substrate 60 may also be rotated while being exposed to the various gas streams. Rotation of the substrate may be useful in preventing the formation of strips in the formed layers. Rotation of the substrate can be continuous or in discrete steps and can occur while the substrate is passing beneath the gas distribution assembly 30 or when the substrate is in a region before and/or after the gas distribution assembly 30.

Sufficient space is generally provided after the gas distribution assembly 30 to ensure complete exposure to the last gas port. Once the substrate 60 has completely passed beneath the gas distribution assembly 30, the first surface 61 has completely been exposed to every gas port in the processing chamber 20. The substrate can then be transported back in the opposite direction or forward. If the substrate 60 moves in the opposite direction, the substrate surface may be exposed again to the reactive gas A, the purge gas, and reactive gas B, in reverse order from the first exposure.

The extent to which the substrate surface 110 is exposed to each gas may be determined by, for example, the flow rates of each gas coming out of the gas port and the rate of movement of the substrate 60. In one embodiment, the flow rates of each gas are controlled so as not to remove adsorbed precursors from the substrate surface 61. The width between each partition, the number of gas ports disposed on the processing chamber 20, and the number of times the substrate is passed across the gas distribution assembly may also determine the extent to which the substrate surface 61 is exposed to the various gases. Consequently, the quantity and quality of a deposited film may be optimized by varying the above-referenced factors.

Although description of the process has been made with the gas distribution assembly 30 directing a flow of gas downward toward a substrate positioned below the gas distribution assembly, it will be understood that this orientation can be different. In some embodiments, the gas distribution assembly 30 directs a flow of gas upward toward a substrate surface. As used in this specification and the appended claims, the term "passed across" means that the substrate has been moved from one side of the gas distribution assembly to the other side so that the entire surface of the substrate is exposed to each gas stream from the gas distribution plate. Absent additional description, the term "passed across" does not imply any particular orientation of gas distribution assemblies, gas flows or substrate positions.

In some embodiments, the shuttle 65 is a susceptor 66 for carrying the substrate 60. Generally, the susceptor 66 is a carrier which helps to form a uniform temperature across the substrate. The susceptor 66 is movable in both directions (left-to-right and right-to-left, relative to the arrangement of FIG. 1) or in a circular direction (relative to FIG. 3). The susceptor 66 has a top surface 67 for carrying the substrate 60. The susceptor 66 may be a heated susceptor so that the substrate 60 may be heated for processing. As an example, the susceptor 66 may be heated by radiant heat lamps 90, a heating plate, resistive coils, or other heating devices, disposed underneath the susceptor 66.

Figure 2:
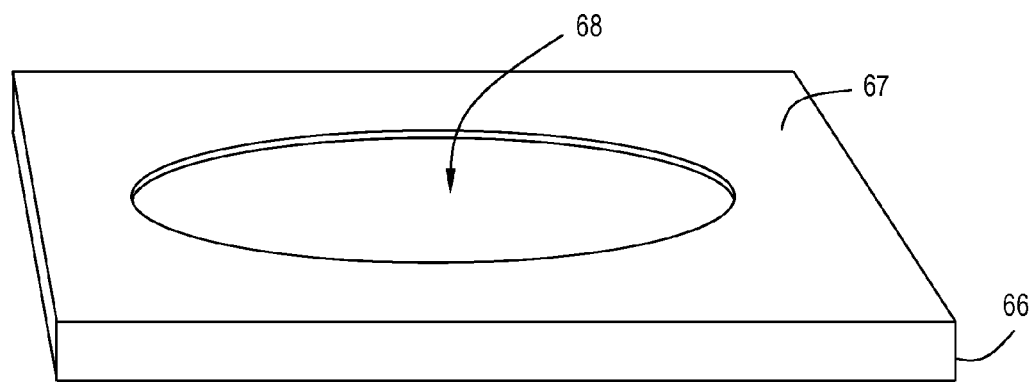
FIG. 2 shows a perspective view of a susceptor in accordance with one or more embodiments of the disclosure.

In still another embodiment, the top surface 67 of the susceptor 66 includes a recess 68 to accept the substrate 60, as shown in FIG. 2. The susceptor 66 is generally thicker than the thickness of the substrate so that there is susceptor material beneath the substrate. In some embodiments, the recess 68 is sized such that when the substrate 60 is disposed inside the recess 68, the first surface 61 of substrate 60 is level with, or substantially coplanar with, the top surface 67 of the susceptor 66. Stated differently, the recess 68 of some embodiments is sized such that when a substrate 60 is disposed therein, the first surface 61 of the substrate 60 does not protrude above the top surface 67 of the susceptor 66. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

FIG. 1 shows a cross-sectional view of a processing chamber in which the individual gas ports are shown. This embodiment can be either a linear processing system in which the width of the individual gas ports is substantially the same across the entire width of the gas distribution plate, or a pie-shaped segment in which the individual gas ports change width to conform to the pie shape. FIG. 3 shows a portion of a pie-shaped gas distribution assembly 30. A substrate would be passed across this gas distribution assembly 30 in an arc shape path 32. Each of the individual gas ports 125, 135, 145, 155 have a narrower width near the inner peripheral edge 33 of the gas distribution assembly 30 a and a larger width near the outer peripheral edge 34 of the gas distribution assembly 30. The shape or aspect ratio of the individual ports can be proportional to, or different from, the shape or aspect ratio of the gas distribution assembly 30 segment. In some embodiments, the individual ports are shaped so that each point of a wafer passing across the gas distribution assembly 30 following path 32 would have about the same residence time under each gas port. The path of the substrates can be perpendicular to the gas ports. In some embodiments, each of the gas distribution assemblies comprise a plurality of elongate gas ports which extend in a direction substantially perpendicular to the path traversed by a substrate. As used in this specification and the appended claims, the term "substantially perpendicular" means that the general direction of movement is approximately perpendicular to the axis of the gas ports. For a pie-shaped gas port, the axis of the gas port can be considered to be a line defined as the mid-point of the width of the port extending along the length of the port. As described further below, each of the individual pie-shaped segments can be configured to deliver a single reactive gas or multiple reactive gases separated spatially or in combination (e.g., as in a typical CVD process).

Figure 4:
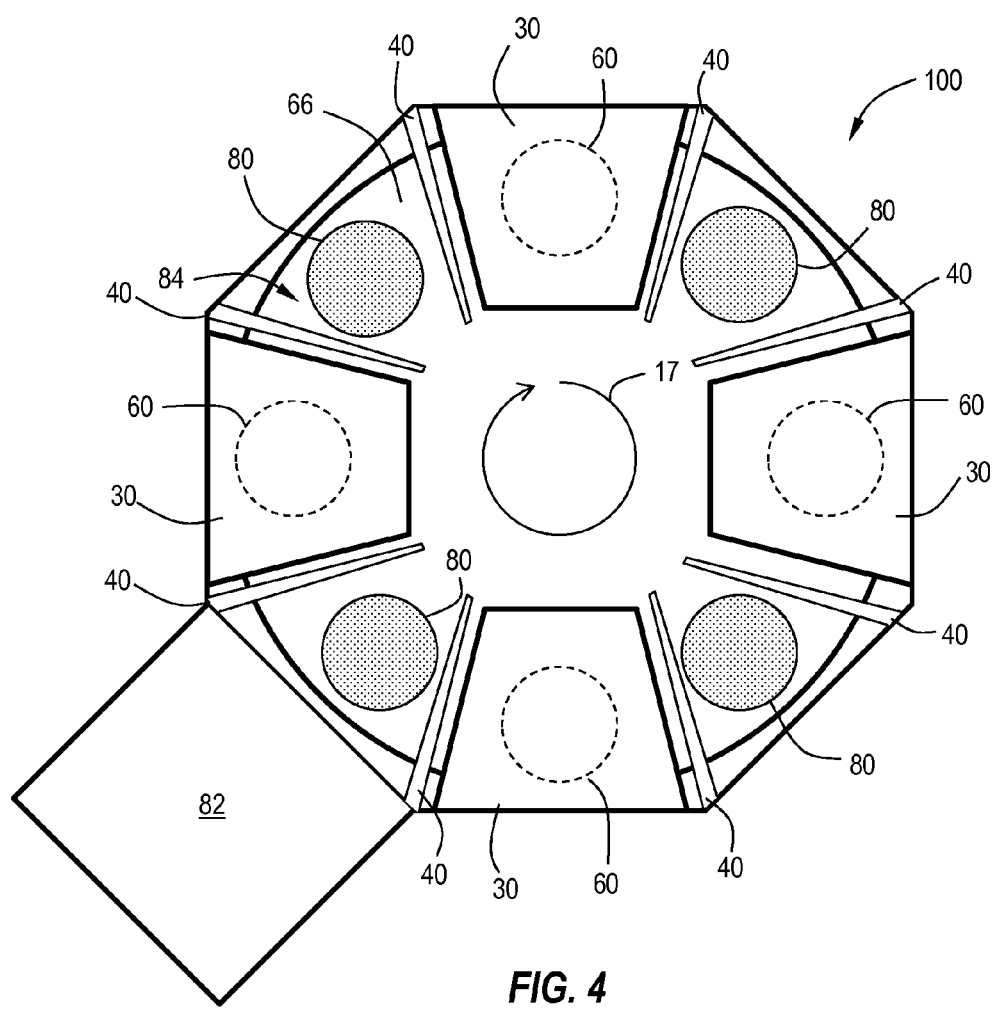
FIG. 4 is a schematic plan view of a substrate processing system configured with four gas distribution assembly units with a loading station in accordance with one or more embodiments of the disclosure.

Processing chambers having multiple gas injectors can be used to process multiple wafers simultaneously so that the wafers experience the same process flow. For example, as shown in FIG. 4, the processing chamber 100 has four gas distribution assemblies 30 and four substrates 60. At the outset of processing, the substrates 60 can be positioned between the gas distribution assemblies 30. Rotating the susceptor 66 of the carousel by 45° will result in each substrate 60 being moved to an gas distribution assembly 30 for film deposition. This is the position shown in FIG. 4. An additional 45° rotation would move the substrates 60 away from the gas distribution assemblies 30. With spatial ALD injectors, a film is deposited on the wafer during movement of the wafer relative to the injector assembly. In some embodiments, the susceptor 66 is rotated so that the substrates 60 do not stop beneath the gas distribution assemblies 30. The number of substrates 60 and gas distribution assemblies 30 can be the same or different. In some embodiments, there are the same number of wafers being processed as there are gas distribution assemblies. In one or more embodiments, the number of wafers being processed are an integer multiple of the number of gas distribution assemblies. For example, if there are four gas distribution assemblies, there are 4× wafers being processed, where x is an integer value greater than or equal to one.

The processing chamber 100 shown in FIG. 4 is merely representative of one possible configuration and should not be taken as limiting the scope of the disclosure. Here, the processing chamber 100 includes a plurality of gas distribution assemblies 30. In the embodiment shown, there are four gas distribution assemblies 30 evenly spaced about the processing chamber 100. The processing chamber 100 shown is octagonal, however, it will be understood by those skilled in the art that this is one possible shape and should not be taken as limiting the scope of the disclosure. The gas distribution assemblies 30 shown are rectangular, but it will be understood by those skilled in the art that the gas distribution assemblies can be pie-shaped segments, like that shown in FIG. 3. Additionally, each segment can be configured to deliver gases in a spatial type arrangement with multiple different reactive gases flowing from the same segment or configured to deliver a single reactive gas or a mixture of reactive gases.

The processing chamber 100 includes a substrate support apparatus, shown as a round susceptor 66 or susceptor assembly. The substrate support apparatus, or susceptor 66, is capable of moving a plurality of substrates 60 beneath each of the gas distribution assemblies 30. A load lock 82 might be connected to a side of the processing chamber 100 to allow the substrates 60 to be loaded/unloaded from the chamber 100.

The processing chamber 100 may include a plurality, or set, of first treatment stations 80 positioned between any or each of the plurality of gas distribution assemblies 30. In some embodiments, each of the first treatment stations 80 provides the same treatment to a substrate 60.

The number of treatment stations and the number of different types of treatment stations can vary depending on the process. For example, there can be one, two, three, four, five, six, seven or more treatment stations positioned between the gas distribution assemblies 30. Each treatment stations can independently provide a different treatment from every other set of treatments station, or there can be a mixture of the same type and different types of treatments.

In some embodiments, one or more of the individual treatments stations provides a different treatment than one or more of the other individual treatment stations. The embodiment shown in FIG. 4 shows four gas distribution assemblies with spaces between which can include some type of treatment station. However, it can be easily envisioned from this drawing that the processing chamber can readily be incorporated with eight gas distribution assemblies with the gas curtains between.

Figure 5:
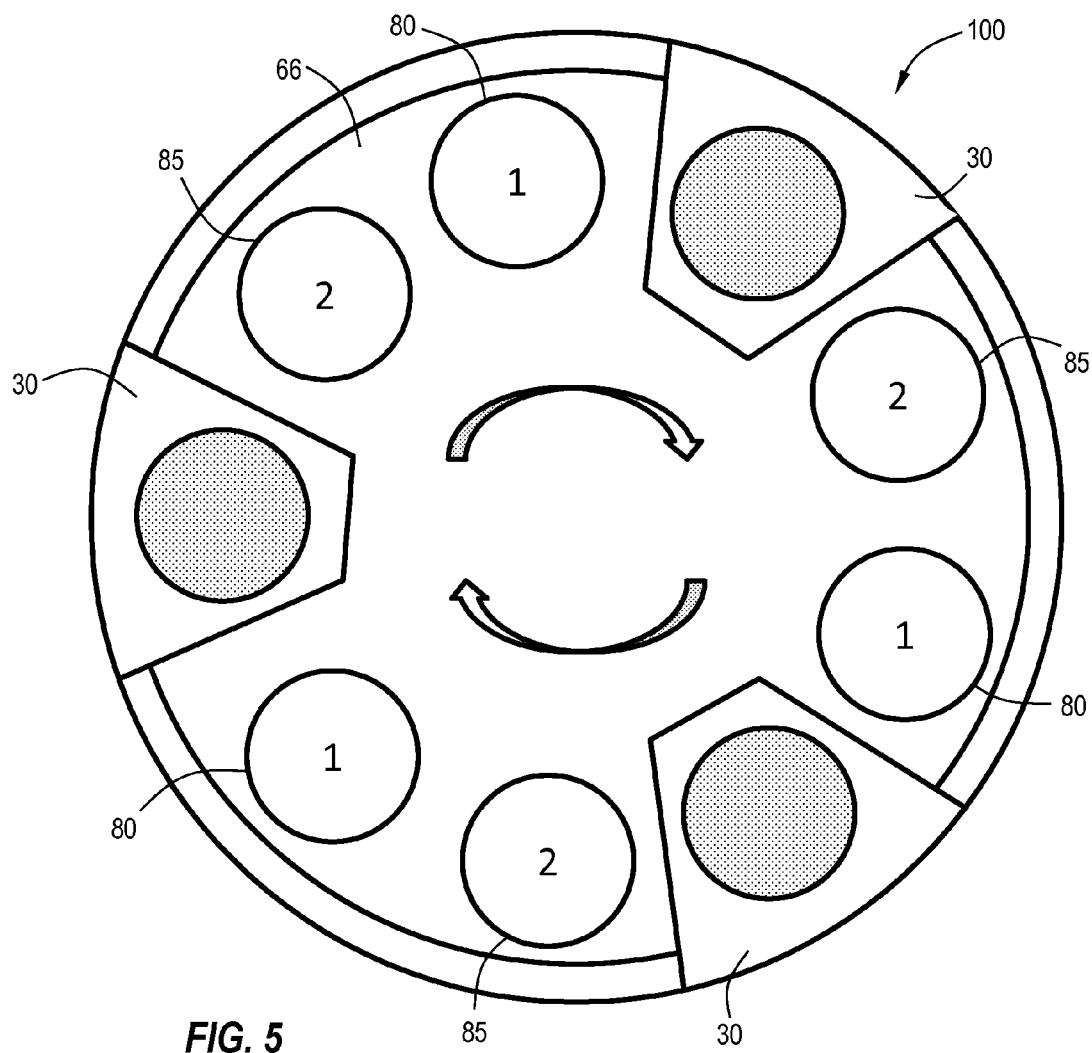
FIG. 5 is a schematic plan view of a substrate processing system configured with three gas distribution assembly units.

In the embodiment shown in FIG. 5, a set of second treatment stations 85 are positioned between the first treatment stations 80 and the gas distribution assemblies 30 so that a substrate 60 rotated through the processing chamber 100 would encounter, depending on where the substrate 60 starts, a gas distribution assembly 30, a first treatment station 80 and a second treatment station 85 before encountering a second of any of these. For example, as shown in FIG. 5, if the substrate started at the first treatment station 80, it would see, in order, the first treatment station 80, a gas distribution assembly 30 and a second treatment station 85 before encountering a second first treatment station 85.

Treatment stations can provide any suitable type of treatment to the substrate, film on the substrate or susceptor assembly. For example, UV lamps, flash lamps, plasma sources and heaters. The wafers are then moved between positions with the gas distribution assemblies 30 to a position with, for example, a showerhead delivering plasma to the wafer. The plasma station being referred to as a treatment station 80. In one or more example, silicon nitride films can be formed with plasma treatment after each deposition layer. As the ALD reaction is, theoretically, self-limiting as long as the surface is saturated, additional exposure to the deposition gas will not cause damage to the film.

Rotation of the carousel can be continuous or discontinuous. In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where it can pause again. Pausing between the injectors may provide time for additional processing steps between each layer deposition (e.g., exposure to plasma).

In some embodiments, the processing chamber comprises a plurality of gas curtains 40. Each gas curtain 40 creates a barrier to prevent, or minimize, the movement of processing gases from the gas distribution assemblies 30 from migrating from the gas distribution assembly regions and gases from the treatment stations 80 from migrating from the treatment station regions. The gas curtain 40 can include any suitable combination of gas and vacuum streams which can isolate the individual processing sections from the adjacent sections. In some embodiments, the gas curtain 40 is a purge (or inert) gas stream. In one or more embodiments, the gas curtain 40 is a vacuum stream that removes gases from the processing chamber. In some embodiments, the gas curtain 40 is a combination of purge gas and vacuum streams so that there are, in order, a purge gas stream, a vacuum stream and a purge gas stream. In one or more embodiments, the gas curtain 40 is a combination of vacuum streams and purge gas streams so that there are, in order, a vacuum stream, a purge gas stream and a vacuum stream. The gas curtains 40 shown in FIG. 4 are positioned between each of the gas distribution assemblies 30 and treatment stations 80, but it will be understood that the curtains can be positioned at any point or points along the processing path.

Figure 6:
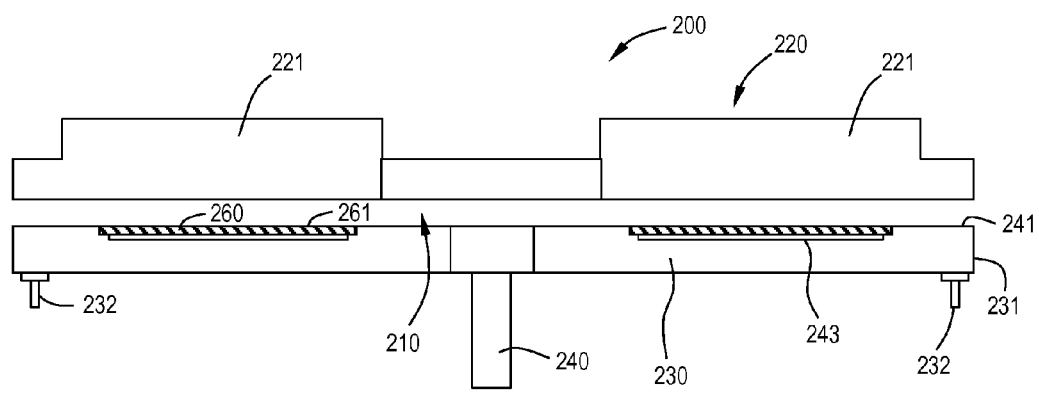
FIG. 6 shows a cross-sectional view of a processing chamber in accordance with one or more embodiments of the disclosure.

FIG. 6 shows an embodiment of a processing chamber 200 including a gas distribution assembly 220, also referred to as the injectors, and a susceptor assembly 230. In this embodiment, the susceptor assembly 230 is a rigid body. The rigid body of some embodiments has a droop tolerance no larger than 0.05 mm. Actuators 232 are placed, for example, at three locations at the outer diameter region of the susceptor assembly 230. As used in this specification and the appended claims, the terms "outer diameter" and "inner diameter" refer to regions near the outer peripheral edge and the inner edge, respectively. The outer diameter is not to a specific position at the extreme outer edge (e.g., near shaft 240) of the susceptor assembly 230, but is a region near the outer edge 231 of the susceptor assembly 230. This can be seen in FIG. 6 from the placement of the actuators 232. The number of actuators 232 can vary from one to any number that will fit within the physical space available. Some embodiments have two, three, four or five sets of actuators 232 positioned in the outer diameter region 231. As used in this specification and the appended claims, the term "actuator" refers to any single or multi-component mechanism which is capable of moving the susceptor assembly 230, or a portion of the susceptor assembly 230, toward or away from the gas distribution assembly 220. For example, actuators 232 can be used to ensure that the susceptor assembly 230 is substantially parallel to the injector assembly 220. As used in this specification and the appended claims, the term "substantially parallel" used in this regard means that the parallelism of the components does not vary by more than 5% relative to the distance between the components.

Once pressure is applied to the susceptor assembly 230 from the actuators 232, the susceptor assembly 230 can be levelled. As the pressure is applied by the actuators 232, the gap 210 distance can be set to be within the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The susceptor assembly 230 is positioned beneath the gas distribution assembly 220. The susceptor assembly 230 includes a top surface 241 and, optionally, at least one recess 243 in the top surface 241. The recess 243 can be any suitable shape and size depending on the shape and size of the wafers 260 being processed. In the embodiment shown, the recess 243 has a step region around the outer peripheral edge of the recess 243. The steps can be sized to support the outer peripheral edge of the wafer 260. The amount of the outer peripheral edge of the wafer 260 that is supported by the steps can vary depending on, for example, the thickness of the wafer and the presence of features already present on the back side of the wafer.

In some embodiments, as shown in FIG. 6, the recess 243 in the top surface 241 of the susceptor assembly 230 is sized so that a wafer 260 supported in the recess 243 has a top surface 261 substantially coplanar with the top surface 241 of the susceptor assembly 230. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 230 of FIG. 6 includes a support post 240 which is capable of lifting, lowering and rotating the susceptor assembly 230. The susceptor assembly 230 may include a heater, or gas lines, or electrical components within the center of the support post 240. The support post 240 may be the primary means of increasing or decreasing the gap between the susceptor assembly 230 and the gas distribution assembly 220, moving the susceptor assembly 230 into rough position. The actuators 232 can then make micro-adjustments to the position of the susceptor assembly to create the desired gap.

Figure 7:
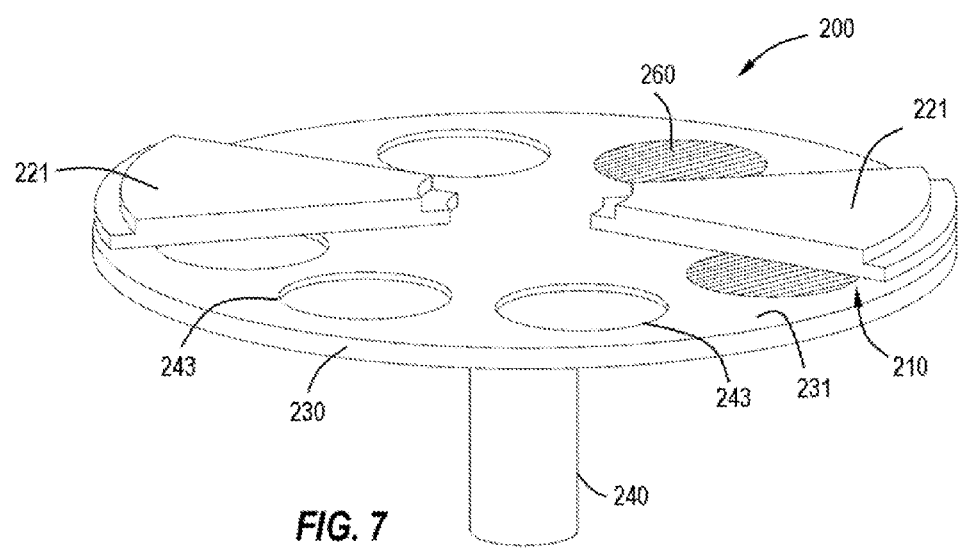
FIG. 7 shows a perspective view of a susceptor assembly and gas distribution assembly units in accordance with one or more embodiments of the disclosure.

The processing chamber 100 shown in FIG. 6 is a carousel-type chamber in which the susceptor assembly 230 can hold a plurality of wafers 260. The gas distribution assembly 220 may include a plurality of separate injector units 221, each injector unit 221 being capable of depositing a film or part of a film on the wafer 260, as the wafer is moved beneath the injector unit 221. FIG. 7 shows a perspective view of a carousel-type processing chamber 200. Two pie-shaped injector units 221 are shown positioned on approximately opposite sides of and above the susceptor assembly 230. This number of injector units 221 is shown for illustrative purposes only. It will be understood that more or less injector units 221 can be included. In some embodiments, there are a sufficient number of pie-shaped injector units 221 to form a shape conforming to the shape of the susceptor assembly 230. In some embodiments, each of the individual pie-shaped injector units 221 may be independently moved, removed and/or replaced without affecting any of the other injector units 221. For example, one segment may be raised to permit a robot to access the region between the susceptor assembly 230 and gas distribution assembly 220 to load/unload wafers 260.

Figure 8:
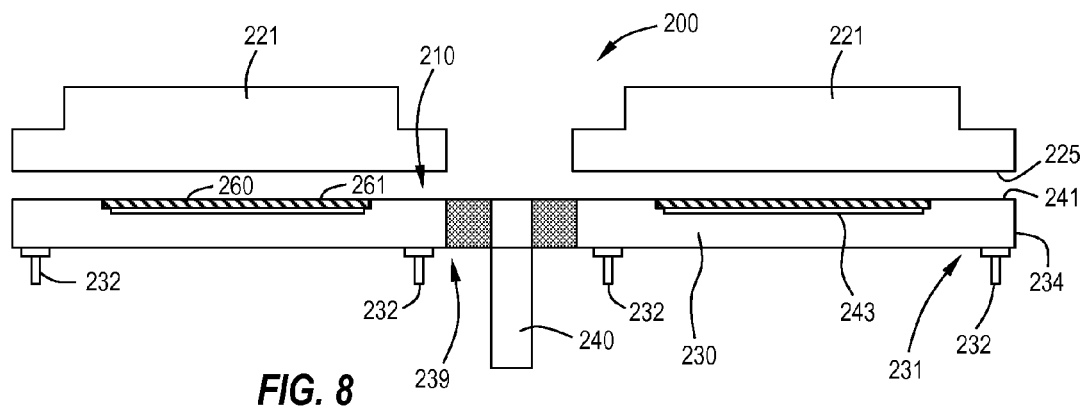
FIG. 8 shows a cross-sectional view of a processing chamber in accordance with one or more embodiments of the disclosure.

FIG. 8 shows another embodiment of the disclosure in which the susceptor assembly 230 is not a rigid body. In some embodiments, the susceptor assembly 230 has a droop tolerance of not more than about 0.1 mm, or not more than about 0.05 mm, or not more than about 0.025 mm, or not more than about 0.01 mm. Here, there are actuators 232 placed at the outer diameter region 231 and at the inner diameter region 239 of the susceptor assembly 230. The actuators 232 can be positioned at any suitable number of places around the inner and outer periphery of the susceptor assembly 230. In some embodiments, the actuators 232 are placed at three locations at both the outer diameter region 231 and the inner diameter region 239. The actuators 232 at both the outer diameter region 231 and the inner diameter region 239 apply pressure to the susceptor assembly 230.

FIG. 9 shows an embodiment of a processing chamber comprising a circular gas distribution assembly with a diverter and a susceptor assembly. The circular gas distribution assembly 220, a portion of which can be seen in FIG. 9 is positioned within the processing chamber and comprises a plurality of elongate gas ports 125, 135, 145 in a front face 225 of the gas distribution assembly 220. The plurality of elongate gas ports 125, 135, 145 extend from an area adjacent the inner peripheral edge 227 toward an area adjacent the outer peripheral edge 228 of the gas distribution assembly 220. The plurality of gas ports shown in FIG. 9 include a first reactive gas port 125, a second reactive gas port 135, a purge gas port 145 which surrounds each of the first reactive gas ports and the second reactive gas ports and vacuum ports 155.

A susceptor assembly 230 is positioned within the processing chamber to rotate at least one substrate in a substantially circular path about a rotational axis. As used in this specification and the appended claims, the term "substantially circular" means that the path is intended to be circular if the substrate were to complete a full rotation. The susceptor assembly has a top surface 241 (as shown in FIG. 8) defined by an inner peripheral edge 229 and an outer peripheral edge 231. The susceptor assembly 230 is positioned below the gas distribution assembly 220 so that the top surface 241 of the susceptor assembly 230 faces the front face 225 of the gas distribution assembly 220.

Referring to FIGS. 9A through 9L, one or more embodiments of the disclosure are directed to processing methods. A substrate 300 having photoresist features 310 thereon is provided. As used in this specification and the appended claims, the term "provided" used in this respect means that the substrate is placed within a processing chamber. Stated differently, a substrate placed within a processing chamber, either manually or by automation, is provided for processing. The photoresist can be any suitable material including, but not limited to, organic films, inorganic films, carbon films, carbon based spin-on films and/or CVD films. The photoresist can be any material that is sensitive to plasma damage and is not limited to materials that exhibit a change in resistance when exposed to light. In some embodiments, the photoresist comprises a material that is material that is physically weak and/or is not too dense so that the material can be damaged by plasma.

While a photoresist is described as forming the features 310, it will be understood that the features can be formed from a different type of material. The term "photoresist features is used merely to distinguish the features shown in FIG. 9A from features shown in subsequent Figures. The photoresist features 310 include a top 311 and sidewalls 312, 313. The width W1 of the feature 310 is defined as the distance between the sidewalls 312, 313. The embodiment shown in the Figures includes a complete feature 310 on the right and a partial feature on the left. The partial feature only shows sidewall 312, while sidewall 313 is outside of the boundary of the drawing. For convenience of description, only one full feature and a partial feature are shown in cross-section. However, it will be understood by those skilled in the art that there can be many features present on a substrate and that the scope of the disclosure is not limited to the embodiment shown.

Figure 9A:
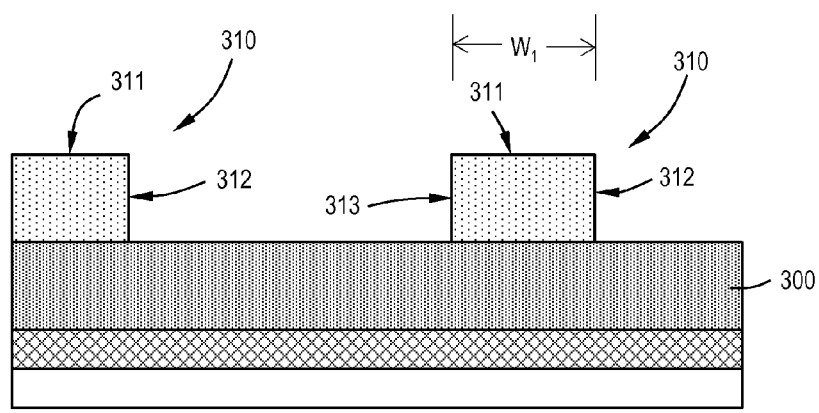
FIGS. 9A-9L show a cross-sectional view of the stages in the self-aligned multiple patterning process according to one or more embodiments of the disclosure.
Figure 9B:
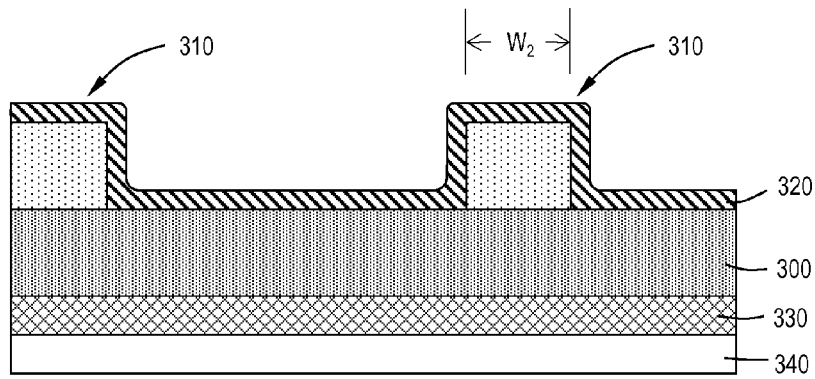

As shown in FIG. 9B, a spacer film 320 is deposited over the substrate 300 and features 310. The spacer film 320 can form a film which conforms to the shape of the substrate 300 surface including the features 310. Deposition of the spacer film 320 results in damage to the feature 310 causing a decrease in the height and width of the feature. The width W2 of feature 310 shown in FIG. 9B is smaller than the width W1 shown in FIG. 9A as a result of the damage.

The spacer film 320 can have any suitable composition and can be deposited by any suitable technique. In some embodiments the spacer film 320 is deposited by ALD or plasma enhanced atomic layer deposition (PE ALD). In a PE ALD process, the substrate 300, and any features thereon, is exposed to a first reactive gas followed by exposure to a second reactive gas comprising a plasma. In some embodiments, the first reactive gas comprises a silicon precursor and the second reactive gas comprises a plasma comprising molecular and/or atomic oxygen (e.g., $O_2$, $O_3$, $H_2O_2$).

In some embodiments, a first layer of a spacer film 320 is deposited on the photoresist features 310 by sequential exposure to a first precursor and a first plasma. Each exposure to the first plasma occurs under a first process condition. Depositing the first layer of spacer film 320 results in a decrease in the width of the plurality of photoresist features 310.

The amount of the spacer film 320 deposited is generally less than 20 monolayers at a first process condition. As an ALD cycle theoretically results in a full monolayer of material being deposited, the term "monolayers" and "layers" used in this regard refer to the number of ALD cycles. The term "process condition" used in this specification and the appended claims refers to the conditions during which processing occurs. For example, the reactive gas composition, reactive species concentration, flow rate, pressure and exposure time, amongst others.

In some embodiments, up to about 10 layers of spacer film 320 are deposited by a first process condition to decrease the width W1 of the photoresist features 310. In one or more embodiments, the number of layers of the spacer film 320 deposited by a first process condition is up to about 9, or up to about 8, or up to about 7, or up to about 6, or up to about 5, or up to about 4, or up to about 3, or up to about 2. In some embodiments, the number of layers of spacer film 320 deposited by the first process condition is in the range of about 2 to about 20, or about 2 to about 10.

Figure 9C:
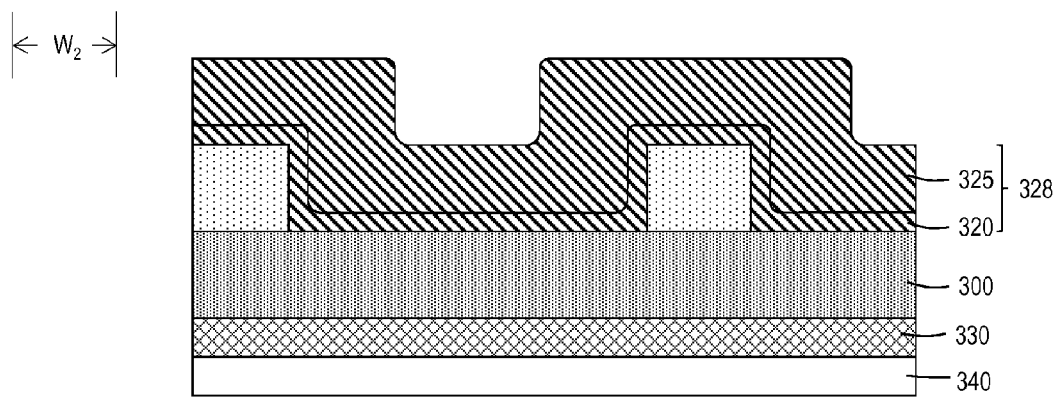

After the deposition of the spacer film 320 and decrease in width of the photoresist features 310, additional spacer film 325 is deposited using a second process condition. FIG. 9C show the spacer film 328. The second process condition is a combination of process parameters including, but not limited to, reactive gas composition, reactive species concentration, flow rate, pressure and exposure time.

In some embodiments, a second layer of a spacer film 325 is deposited by sequential exposure to a second precursor and a second plasma to form a spacer film 325. Each exposure to the second plasma occurs under a second process condition different from the first process condition. Depositing the second layer of spacer film 325 results in substantially no change in the width of the photoresist features 310.

The additional spacer film 325 is deposited to create a film 328 having a total thickness of less than about 50 nm. The total thickness of the film 328 is the sum of the thickness of films comprising the spacer film 320 and the additional spacer film 325. In some embodiments, the total thickness of the spacer film 328 is less than about 45 nm, or less than about 40 nm, or less than about 35 nm, or less than about 30 nm, or less than about 25 nm, or less than about 20 nm. In one or more embodiments, the total thickness of the spacer film 328 is in the range of about 15 nm to about 40 nm, or in the range of about 20 nm to about 30 nm.

The first precursor and the second precursor can be the same or different. The first plasma and the second plasma can also be the same or different. In one or more embodiments, the first precursor and second precursor comprise a silicon precursor and the first plasma and the second plasma comprise one or more of oxygen, ozone and peroxide.

In some embodiments, the first process condition comprises exposure to a plasma for a first exposure time. In one or more embodiments, the second process condition comprises exposure to a plasma for a second exposure time which is different from the first exposure time. The second exposure time can be shorter than or longer than the first exposure time. The first process condition and the second process condition can be substantially the same (e.g., the same reactive gases, concentrations) with only the exposure time to the plasma being different. As used in this specification and the appended claims, the term "substantially the same" used in this regard means that the process conditions are about the same taking into account normal variations in process parameters.

The spacer film 320 and additional spacer film 325 of some embodiments comprises silicon oxide. The silicon oxide can be deposited by sequential exposure of the substrate a silicon precursor and a plasma. The silicon precursor can be any suitable silicon precursors including, but not limited, to silicon halides and organosilicates. The plasma of some embodiments comprises one or more of oxygen, ozone, ammonia, nitrogen or peroxide.

The plasma of some embodiments is a remote plasma. As used in this specification and the appended claims, the term "remote plasma" refers to a plasma that is generated a distance away from the surface of the substrate and flowed to the surface of the substrate.

In some embodiments, the remote plasma flows through a diffuser comprising a plurality of holes prior to contact with the substrate. It is believed that inclusion of the diffuser results in the reduction of the number of ions in the plasma relative to the number of radicals. The higher radical/ion ratio is believed to form a more consistent and controllable damage to the features and form a higher quality spacer film. The size of the holes in the diffuser may also impact this ratio. In some embodiments, the diffuser has a plurality of holes having a diameter less than about 4 mm, 3 mm, 2 mm or 1 mm.

Figure 9D:
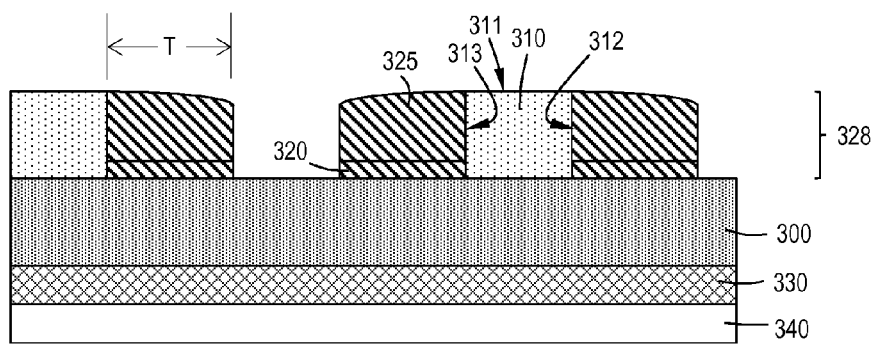

After the spacer layer 328 has been deposited to the predetermined thickness, the spacer layer 328 is etched. FIG. 9D shows the results of the etching process. Etching removes the spacer material from the top surface of the photoresist features leaving the spacer film on the sidewalls of the feature. Stated differently, etching removes substantially all of the spacer layer from the top 311 of the photoresist feature 310 and without removing substantially any of the spacer layer from the sidewalls 312, 313. As used in this specification and the appended claims, the term "substantially all" when referring to the removal of the spacer layer from the top surface of the feature means that at least about 98% of the material on the surface has been removed. As used in this specification and the appended claims, the term "not removing substantially any" when referring to the removal of the spacer layer from the sidewalls of the feature means that the thickness T of the spacer layer on the feature is reduced by no more than about 10%, or 5%, or 2% or 1%.

Figure 9E:
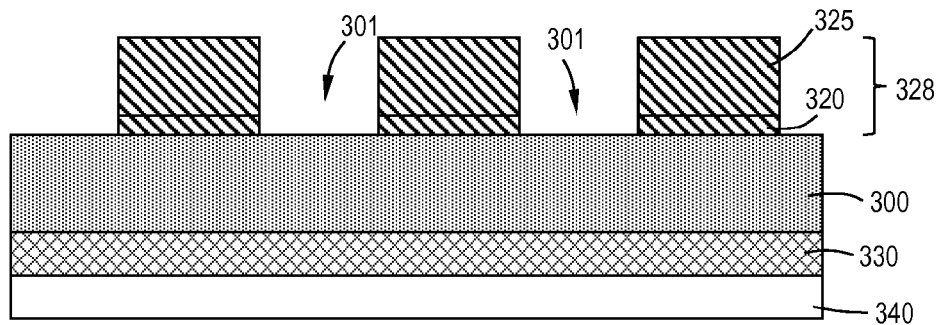

Referring to FIG. 9E, the photoresist features 310 have been removed, leaving the spacer film 328 that was adjacent to the sidewalls 312, 313 of the features 310. With the photoresist features removed, exposed portions 301 of the substrate 300 become accessible.

Figure 9F:
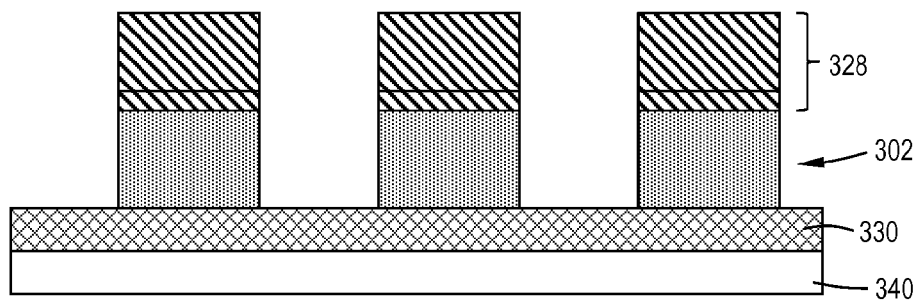
Figure 9G:
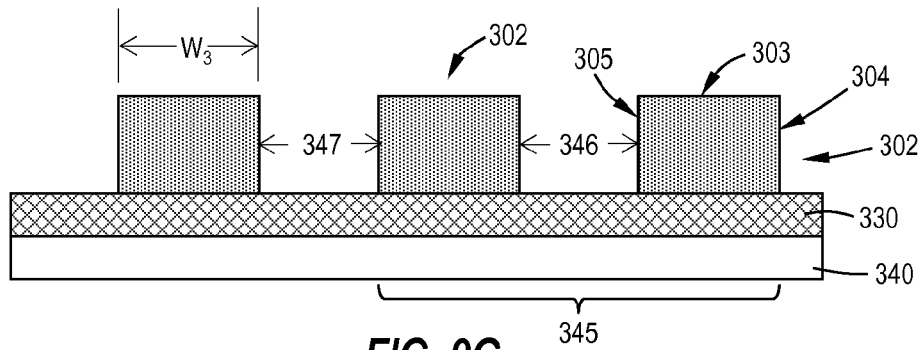

In FIG. 9F, the exposed portions 301 of the substrate 300 are etched to produced additional features on the substrate, referred to as substrate features 302. In FIG. 9G, the exposed portions 301 of the substrate 300 and the spacer layer 328 are etched to produce additional features on the substrate. The features formed in FIGS. 9F and 9G are referred to as substrate features 302 to distinguished over the photoresist features 310. In some embodiments, the process proceeds from FIG. 9E to 9G in a single process. In some embodiments, the process proceeds from FIG. 9E to 9F to 9G in sequential processes.

At this point, every photoresist feature 310 from FIG. 9A has been doubled into substrate features 302 in FIG. 9G. The process up to this point is often referred to as Self-Aligned Double Patterning (SADP). The substrate features 302 formed have a top surface 303, sidewalls 304, 305 and a width W3. The embodiment in FIG. 9G shows 1½ pairs of adjacent features. The middle and right feature form a pair 345 and the left feature is one half of the adjacent pair of features.

The substrate features 302 formed are described as having two critical dimensions (CD); a pair critical dimension and an adjacent critical dimension. The pair critical dimension 346 is defined as the distance between each of the features 302 in the pair 345. The adjacent critical dimension 347 is defined as the distance between the features of an adjacent pair. In one or more embodiments, the ratio of the adjacent critical dimension 347 to the pair critical dimension 346 is in the range of about 0.9:1 to about 1:0.9, or in the range of about 0.95:1 to about 1:0.95 or about 1:1. The difference between the pair critical dimension 346 and the adjacent critical dimension 347 of some embodiments is in the range of about −1.5 nm to about 1.5 nm, or in the range of about −1 nm to about 1 nm. In some embodiments, the absolute value of the difference between the pair critical dimension 346 and the adjacent critical dimension 347 is less than or equal to about 1.5 nm, or 1.4 nm, or 1.3 nm, or 1.2 nm, or 1.1 nm, or 1.0 nm.

Figure 9H:
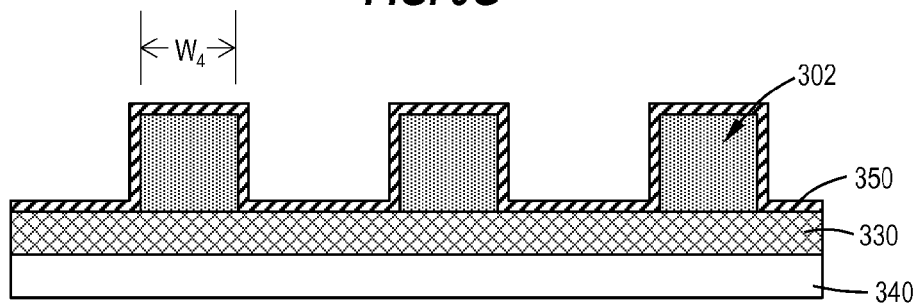

The substrate features 302 have a top 303 and sidewalls 304, 305. The width W3 of the feature 302 is defined as the distance between the sidewalls 304, 305. As shown in FIG. 9H, a second spacer film 350 is deposited over the second substrate 330 and first features 302. The spacer film 350 can form a film which conforms to the shape of the second substrate 330 surface including the features 302. Deposition of the spacer film 350 results in damage to the features 302 causing a decrease in the height and width of the features. The width W4 of feature 302 shown in FIG. 9H is smaller than the width W3 shown in FIG. 9G as a result of the damage.

The second spacer film 350 can have any suitable composition and can be deposited by any suitable technique. In some embodiments the second spacer film 350 and features thereon are exposed to a third reactive gas followed by exposure to a fourth reactive gas comprising a plasma. In some embodiments, the third reactive gas comprises a silicon precursor and the fourth reactive gas comprises a plasma comprising molecular and/or atomic oxygen (e.g., $O_2$, $O_3$, $H_2O_2$).

In some embodiments, a first layer of the second spacer film 350 is deposited on the photoresist features 310 by sequential exposure to a third precursor and a third plasma. Each exposure to the third plasma occurs under a third process condition.

The amount of the spacer film 350 deposited is generally less than 20 monolayers at a third process condition. As an ALD cycle theoretically results in a full monolayer of material being deposited, the term "monolayers" and "layers" used in this regard refer to the number of ALD cycles. In some embodiments, up to about 10 layers of second spacer film 350 are deposited by a third process condition to decrease the width W3 of the substrate features 302. In one or more embodiments, the number of layers of the second spacer film 350 deposited by a third process condition is up to about 9, or up to about 8, or up to about 7, or up to about 6, or up to about 5, or up to about 4, or up to about 3, or up to about 2. In some embodiments, the number of layers of second spacer film 350 deposited by the third process condition is in the range of about 2 to about 20, or about 2 to about 10.

Figure 9I:
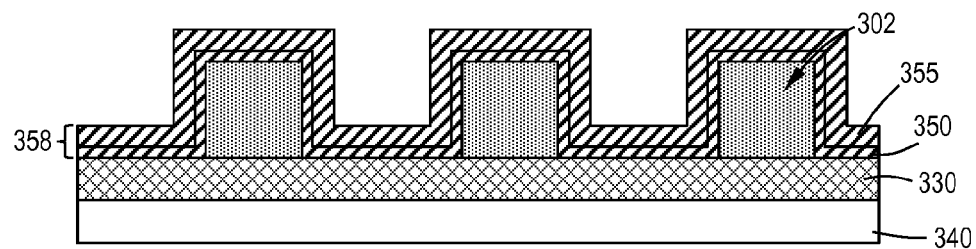

After the deposition of the second spacer film 350 and decrease in width of the substrate features 302, additional spacer film 355 is deposited using a fourth process condition. FIG. 9I show the spacer film 358. The fourth process condition is a combination of process parameters including, but not limited to, reactive gas composition, reactive species concentration, flow rate, pressure and exposure time.

In some embodiments, a second layer of a second spacer film 355 is deposited by sequential exposure to a fourth precursor and a fourth plasma to form a second spacer film 355. Each exposure to the fourth plasma occurs under a fourth process condition different from the third process condition. Depositing the second layer of second spacer film 355 results in substantially no change in the width of the substrate features 302.

The additional second spacer film 355 is deposited to create a film 358 having a total thickness of less than about 50 nm. The total thickness of the film 358 is the sum of the thickness of films comprising the second spacer film 350 and the additional second spacer film 355. In some embodiments, the total thickness of the second spacer film 358 is less than about 45 nm, or less than about 40 nm, or less than about 35 nm, or less than about 30 nm, or less than about 25 nm, or less than about 20 nm. In one or more embodiments, the total thickness of the second spacer film 328 is in the range of about 15 nm to about 40 nm, or in the range of about 20 nm to about 30 nm.

The third precursor and the fourth precursor can be the same or different. The third plasma and the fourth plasma can also be the same or different. In one or more embodiments, the third precursor and fourth precursor comprise a silicon precursor and the third plasma and the fourth plasma comprise one or more of oxygen, ozone and peroxide.

In some embodiments, the third process condition comprises exposure to a plasma for a third exposure time. In one or more embodiments, the fourth process condition comprises exposure to a plasma for a fourth exposure time which is different from the third exposure time. The fourth exposure time can be shorter than or longer than the third exposure time. The third process condition and the fourth process condition can be substantially the same (e.g., the same reactive gases, concentrations) with only the exposure time to the plasma being different. As used in this specification and the appended claims, the term "substantially the same" used in this regard means that the process conditions are about the same taking into account normal variations in process parameters.

The second spacer film 350 and additional second spacer film 355 of some embodiments comprises silicon oxide. The silicon oxide can be deposited by sequential exposure of the substrate a silicon precursor and a plasma. The silicon precursor can be any suitable silicon precursors including, but not limited, to silicon halides and organosilicates. The plasma of some embodiments comprises one or more of oxygen, ozone, ammonia, nitrogen or peroxide.

The plasma of some embodiments is a remote plasma similar to the remote plasma described above with respect to the formation of the substrate features 302. In some embodiments, the remote plasma flows through a diffuser comprising a plurality of holes prior to contact with the substrate.

Figure 9J:
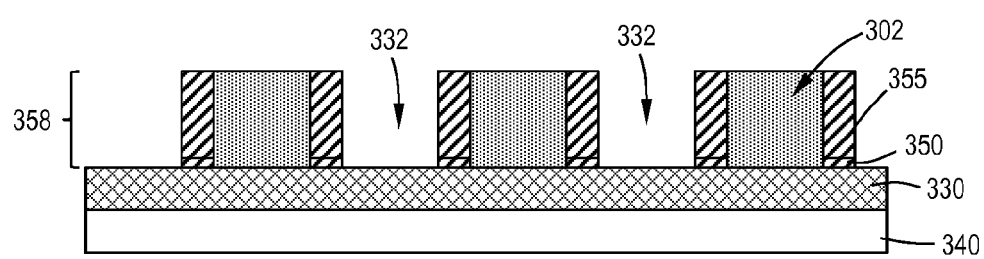

After the second spacer layer 358 has been deposited to the predetermined thickness, the second spacer layer 358 is etched. FIG. 9J shows the results of the etching process. Etching removes the spacer material from the top 303 surface of the substrate features 302 leaving the spacer film 358 on the sidewalls 304, 305 of the substrate feature 302. Stated differently, etching removes substantially all of the second spacer layer from the top 303 of the substrate feature 302 and without removing substantially any of the second spacer layer from the sidewalls 304, 305

Figure 9K:
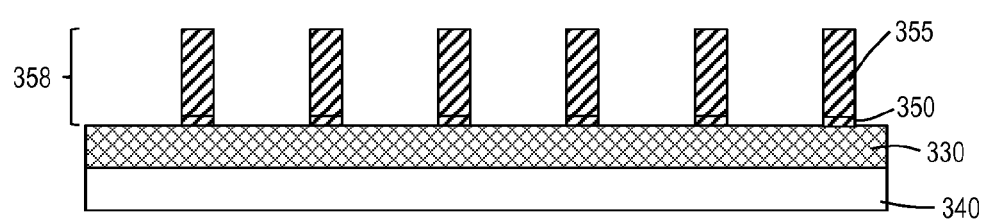

Referring to FIG. 9K, the substrate features 302 have been removed, leaving the second spacer film 358 that was adjacent to the sidewalls 304, 305 of the substrate features 302. With the substrate features 302 removed, exposed portions 332 of the second substrate 330 become accessible.

Figure 9L:
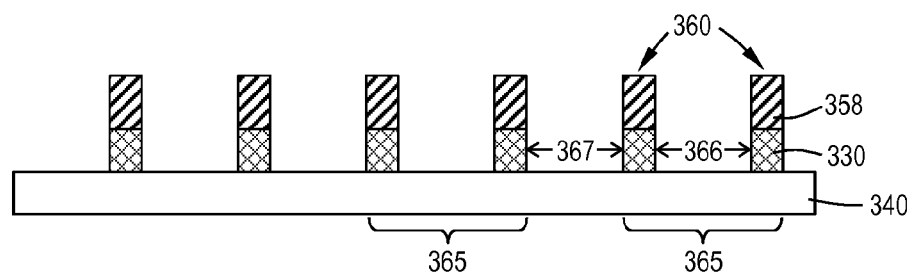

In FIG. 9L, the exposed portions 332 of the second substrate 330 are etched to produce additional features on the substrate, referred to as second features 360. In the embodiment shown in FIG. 9L, the second features 360 have small amounts of second spacer layer 358 thereon. In some embodiments, the second features 360 have little or no second spacer layer 358.

At this point, every photoresist feature 310 from FIG. 9A has been quadrupled into second features 360 in FIG. 9L. The process up to this point is often referred to as Self-Aligned Quadruple Patterning (SAQP).

The second features 360 formed are paired 365 and can be described as having two critical dimensions (CD); a pair critical dimension 366 and an adjacent critical dimension 367. The pair critical dimension 366 is defined as the distance between each of the second features 360 in the pair 365. The adjacent critical dimension 367 is defined as the distance between the features of an adjacent pair. In one or more embodiments, the ratio of the adjacent critical dimension 347 to the pair critical dimension 346 is in the range of about 0.9:1 to about 1:0.9, or in the range of about 0.95:1 to about 1:0.95 or about 1:1. The difference between the pair critical dimension 346 and the adjacent critical dimension 347 of some embodiments is in the range of about −1.5 nm to about 1.5 nm, or in the range of about −1 nm to about 1 nm. In some embodiments, the absolute value of the difference between the pair critical dimension 346 and the adjacent critical dimension 347 is less than or equal to about 1.5 nm, or 1.4 nm, or 1.3 nm, or 1.2 nm, or 1.1 nm, or 1.0 nm.

Some embodiments of the disclosure are directed to methods of processing a substrate using a processing chamber which has a plurality of sections, where each section is separated from adjacent sections by a gas curtain. As used in this specification and the appended claims, the terms "section", "region" and "sector" are used interchangeably to describe an area within a batch processing chamber. Upon entering the processing chamber, the substrate (also called a wafer) can be in any of the individual sections. Each section can have the same or different processing conditions from the adjacent sections. As used in this specification and the appended claims, the term "processing condition," and the like, means the entirety of the conditions within the individual section. For example, processing conditions include, but are not limited to, gas composition, pressure, flow rate, temperature and plasma. Processing conditions can be configured to, for example, deposition, etching and treatment (e.g., densification, annealing).

With reference to the process illustrated by FIGS. 9A through 9L, some embodiments of the disclosure utilize a batch processing chamber like that shown in FIG. 4. A substrate 300 having a photoresist with photoresist features 310 thereon is positioned or placed into a processing chamber. Each of the photoresist features 310 has a top 311, sidewalls 312, 313 and a width W.

Up to ten first PE ALD layers of a spacer film 320 can be deposited onto the photoresist features 310. The first PE ALD process decreases the width W of the photoresist features 310 and comprises exposing the substrate to a first process gas in a first processing region of the processing chamber. The first process gas comprises a silicon precursor. After exposure to the first process gas, the substrate is moved laterally through a gas curtain to a second process region in the processing chamber. In the second region of the processing chamber, the substrate is exposed to a second process gas comprising a plasma for a first exposure time.

Additional spacer film 325 is deposited onto the spacer film 320 by repeating a second PE ALD process to form a spacer film 328 having a total thickness in the range of about 10 nm to about 50 nm. The second PE ALD process comprises exposing the substrate to a third process gas in a third processing region where the third process gas comprises a silicon precursor. In some embodiments the third process gas is the same as the first process gas. In some embodiments the process conditions in the first processing region are the same as, or substantially the same as, the process conditions in the third processing region.

After exposure to the third processing region, the substrate is moved laterally through a gas curtain to a fourth processing region. In the fourth processing region, the substrate is exposed to a fourth process condition comprising depositing additional spacer film by repeating a second PE ALD process to form a spacer film having a total thickness in the range of about 10 nm to about 50 nm, the second PE ALD process comprising a fourth process gas for a second exposure time. The fourth process gas comprises a plasma and the substrate is exposed to the fourth process gas for a second exposure time which is shorter than the first exposure time.

After depositing, the spacer film 328 is etched to remove substantially all of the spacer film from the top of the photoresist features without removing substantially any of the spacer film from the sidewalls of the photoresist features. The patterned photoresist is removed to expose the substrate 300 beneath the photoresist features 310 and leave the spacer film 328 from the sidewalls of the photoresist features 310. The exposed substrate 301 is etched to form adjacent pairs of first features 302 comprising the substrate material 300. The adjacent pairs of first features 302 adjacent critical dimension 347 and pair critical dimension 346. The first features 301 have a top 303, sidewalls 304, 305 and a width W3. At this point each photoresist feature 310 has been doubled into two first features 302.

Following the formation of the first features 301, in some embodiments, the processing can be continued in a similar fashion. Up to about ten PE ALD layers of a second spacer 350 are deposited over the first features 302 and the second substrate 330. The deposition of the second spacer 350 results in the decrease in width of the first features to a fourth width W4. This is shown in FIG. 9H.

The third PE ALD process comprises exposing the surface to a fifth process gas in a fifth processing region of the processing chamber. The fifth process gas comprises a silicon precursor which can be the same as or different from the silicon precursor in the first processing region and/or third processing region.

After depositing the second spacer 350 onto the surface, the substrate is moved laterally through a gas curtain to a sixth process region in the processing chamber. In the sixth processing region, the substrate is exposed to a sixth process gas comprising a plasma for a third exposure time. The plasma can be the same as or different from that of either the second process gas and/or the fourth process gas.

After the second spacer film has been deposited and the width of the first features 302 have been reduced, additional second spacer film 358 is deposited on the second spacer 350 by repeating a fourth PE ALD process. The second spacer film 358 is grown to a total thickness in the range of about 10 nm to about 50 nm.

The fourth PE ALD process comprises exposing the substrate to a seventh process gas in a seventh processing region where the seventh process gas comprises a silicon precursor. The silicon precursor of the seventh process gas can be the same as or different from any of the first process gas, third process gas and/or fifth process gas.

The substrate is then moved laterally through a gas curtain to an eighth process region it the processing chamber. In the eighth processing region, the substrate is exposed to an eighth process gas comprising a plasma for a fourth exposure time. The fourth exposure time can be longer than or shorter than the third exposure time. In some embodiments, the fourth exposure time is shorter than the third exposure time. FIG. 9I shows the surface at this point in the process with the second spacer 358 conformally covering the first features 302 and the second substrate 330.

After being deposited, the second spacer 358 is etched to remove substantially all of the second spacer film 358 from the top 303 of the first features 302 without removing substantially any of the second spacer film 358 from the sidewalls 304, 305 of the first features 302. This is shown in FIG. 9J.

The first features 302 are removed to expose a second substrate 330 beneath the first features 302 and leave the second spacer film 358 from the sidewalls of the first features 302. The exposed portions 332 of the second substrate 330 are etched to form adjacent pairs 365 of second features 360. The adjacent pairs 365 of second features 360 have an adjacent critical dimension 367 and a pair critical dimension 366.

In the first section, the substrate, or a portion of the substrate, is exposed to a first process condition to deposit a first film on the surface of the substrate. The substrate surface can be a bare substrate surface or any layer previously deposited on the surface. The individual surface composition can vary and should not be taken as limiting the scope of the disclosure. In some embodiments, the first process conditions in the first section comprise a silicon-containing precursor. The silicon-containing precursor adsorbs (or similar mechanism) to the substrate surface forming a silicon-containing film.

After formation of the silicon-containing film, the substrate is laterally moved through a gas curtain to a second section of the processing chamber. In the second section, the silicon-containing film is exposed to second process conditions to form a second film. The second process conditions comprise a reactant that can react with the silicon-containing film to form a silicon oxide film.

During the movement from the first section to the second section, the substrate is exposed to the first process conditions, the second process conditions and a gas curtain which separates the two. The gas curtain can be, for example, a combination of inert gases and vacuum to ensure that there is minimal, if any, gas phase reaction between the first process conditions and the second process conditions. At some time during the movement, part of the surface is exposed to the first process conditions, another part of the surface is exposed to the second process conditions and an intermediate portion, between the other two portions, of the substrate is exposed to the gas curtain. The movement between the third and fourth, fifth and sixth, and seventh and eighth sections occurs similarly so that at some point the substrate is exposed to multiple sections at the same time with the gas curtain between.

During transfer from any section to an adjacent section, a first portion of the surface is exposed to one process conditions at the same time that a second portion of the surface is exposed to another process conditions and an intermediate portion of the substrate is exposed to the gas curtain. As used in this specification and the appended claims, the term "intermediate portion" used in this respect means a portion of the substrate between the first portion with is exposed to one process condition and the second portion which is exposed to a different process condition.

Figure 10:
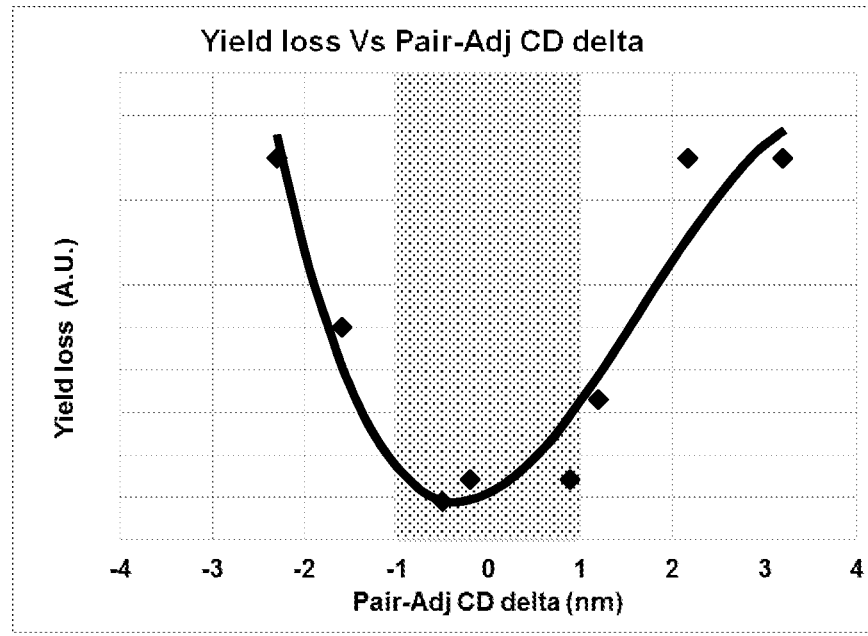
FIG. 10 shows a graph of the yield loss as a function of the difference in pair-adjacent critical dimensions.

FIG. 10 shows a graph of the yield loss as a function of the difference in the pair critical dimension and adjacent critical dimension. It can be seen that when the difference between the pair CD and adjacent CD is close to zero, there was a decrease in the yield loss.

Figure 11:
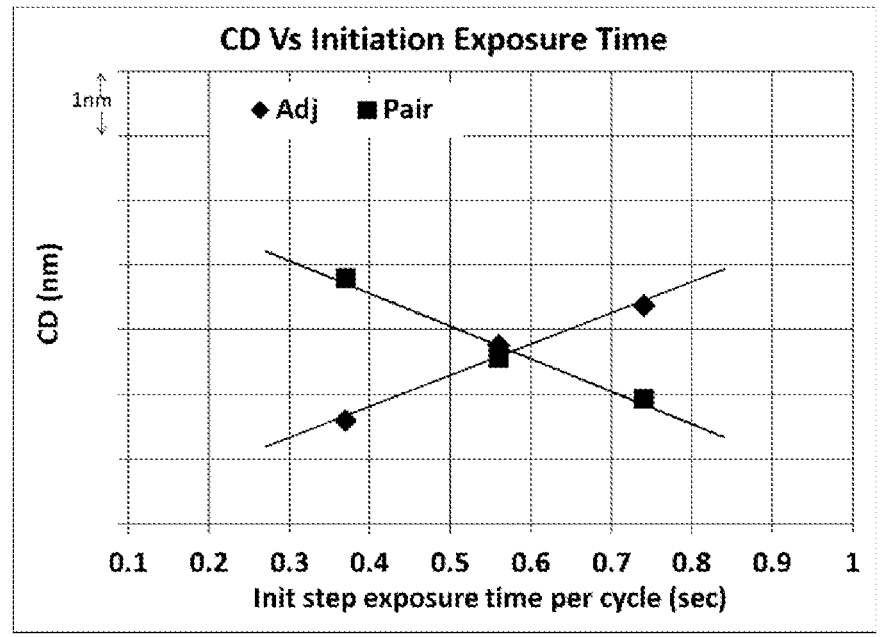
FIG. 11 shows a graph of the pair CD and adjacent CD as a function of the time of the initiation step exposure.

FIG. 11 shows a graph of the pair critical dimension and adjacent critical dimension as a function of the exposure time of the initiation step of the spacer formation. The initiation step was the first spacer layers deposited up to about 10 nm as described above. The exposure time of the initiation step showed a linear trend to the CDs in adjacent space and in pair space.

In some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not be used. Indeed, other embodiments relate to deposition processes under very mild conditions without a plasma.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by any suitable means including, but not limited to, changing the temperature of the substrate support (e.g., susceptor) and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

While the foregoing is directed to embodiments of the present invention, other and further embodiments of the disclosure may be devised without departing from the basic scope thereof, and the scope thereof is determined by the claims that follow.

What is claimed is:

1. A semiconductor device processing method comprising:
    providing a substrate having a photoresist features thereon, each of the features having a top, sidewalls and a width;
    depositing up to 10 layers of an initial spacer film using a first process condition to decrease the width of the photoresist features;
    depositing additional spacer film on the initial spacer film using a second process condition to form a an integrated spacer film having a total thickness less than about 50 nm;
    etching the integrated spacer film from the top of the photoresist features leaving the integrated spacer film on the sidewalls of the photoresist features;
    removing the photoresist features to leave the integrated spacer film and expose portions of the substrate previously occupied by the photoresist features; and
    etching the exposed portions of the substrate to form adjacent pairs of substrate features.

2. The processing method of claim 1, wherein the first process condition comprises exposure to a plasma for a first exposure time.

3. The processing method of claim 2, wherein the second process condition comprises exposure to a plasma for a second exposure time different from the first exposure time.

4. The processing method of claim 3, wherein the second exposure time is shorter than the first exposure time.

5. The processing method of claim 1, wherein there are up to 5 monolayers of the initial spacer film deposited with the first process condition.

6. The processing method of claim 1, wherein the initial spacer film comprises silicon oxide.

7. The processing method of claim 1, wherein the initial spacer film is deposited by PE ALD comprising sequential exposure of the substrate to a silicon precursor and a plasma.

8. The processing method of claim 7, wherein the plasma is a remote plasma.

9. The processing method of claim 8, wherein the remote plasma flows through a diffuser comprising a plurality of holes prior to contact with the substrate.

10. The processing method of claim 9, wherein the holes in the diffuser have a diameter less than about 3 mm.

11. The processing method of claim 7, wherein the substrate is exposed to the silicon precursor in a first processing region of a processing chamber, moved laterally through a gas curtain to a second processing region of the processing chamber where the substrate is exposed to the plasma.

12. The processing method of claim 7, wherein the plasma comprises one or more of oxygen, nitrogen, ammonia or ozone.

13. The processing method of claim 1, wherein the adjacent pairs of substrate features define an adjacent critical dimension defining the space between a pair of features and an adjacent pair of features and a pair critical dimension defined as the space between individual members of the substrate feature pair.

14. The processing method of claim 13, wherein a ratio of the adjacent critical dimension to the pair critical dimension is about 1:1.

15. A semiconductor device processing method comprising:
    providing a substrate with a patterned photoresist thereon, the patterned photoresist comprising a plurality of photoresist features, each photoresist feature having at least one sidewall, a top and a width;

depositing a first layer of a spacer film by sequential exposure of the photoresist to a first precursor and a first plasma, each exposure to the first plasma occurring under a first process condition, wherein depositing the first layer results in a decrease in the width of the plurality of photoresist features;

depositing a second layer of a spacer film by sequential exposure of the photoresist features to a second precursor and a second plasma to form the spacer film, each exposure to the second plasma occurring under a second process condition different from the first process condition, wherein depositing the second layer results in substantially no change in the width of the photoresist features;

etching the spacer film to remove substantially all of the spacer film from the top of the photoresist features without removing substantially any of the spacer film from the sidewalls of the photoresist features;

removing the patterned photoresist features to expose the substrate and leave the spacer film on the substrate; and etching the exposed substrate to form adjacent pairs of first features comprising the substrate material, the adjacent pairs of first features having adjacent critical dimension and pair critical dimension.

16. The processing method of claim 15, wherein the first process condition comprises an exposure time that is less than an exposure time of the second process condition.

17. The processing method of claim 15, wherein the spacer film is deposited by PE ALD comprising sequential exposure of the substrate to a silicon precursor and a remote plasma.

18. The processing method of claim 17, wherein the plasma comprises one or more of oxygen, nitrogen, ammonia or ozone.

19. A semiconductor device processing method comprising:

positioning a substrate having a photoresist with photoresist features thereon in a processing chamber, each of the photoresist features having a top, sidewalls and a width;

depositing up to ten PE ALD layers of an initial spacer film, each layer deposited by a first PE ALD process to decrease the width of the photoresist features, the first PE ALD process comprising,
  exposing the substrate to a first process gas in a first processing region of the processing chamber, the first process gas comprising a silicon precursor,
  laterally moving the substrate through a gas curtain to a second process region in the processing chamber,
  exposing the substrate to a second process gas in the second process region for a first exposure time, the second process gas comprising a plasma;

depositing additional spacer film by repeating a second PE ALD process to form an integrated spacer film having a total thickness in the range of about 10 nm to about 50 nm, the second PE ALD process comprising,
  exposing the substrate to a third process gas in a third processing region, the third process gas comprising a silicon precursor,
  laterally moving the substrate through a gas curtain to a fourth process region in the processing chamber,
  exposing the substrate to a fourth process gas in the fourth process region for a second exposure time, the second process gas comprising a plasma, the second exposure time being shorter than the first exposure time;

etching the integrated spacer film to remove substantially all of the integrated spacer film from the top of the photoresist features without removing substantially any of the integrated spacer film from the sidewalls of the photoresist features;

removing the photoresist features to expose portions of the substrate previously occupied by the photoresist features and leave the integrated spacer film on the substrate; and etching the exposed substrate to form adjacent pairs of first features comprising the substrate material, the adjacent pairs of first features having adjacent critical dimension and pair critical dimension, the first features having a top, sidewalls and a width.

20. The processing method of claim 19, further comprising:

depositing up to ten PE ALD layers of a second initial spacer film on the first features, each layer deposited by a third PE ALD process to decrease the width of the first features, the third PE ALD process comprising,
  exposing the substrate to a fifth process gas in a fifth processing region of the processing chamber, the fifth process gas comprising a silicon precursor,
  laterally moving the substrate through a gas curtain to a sixth process region in the processing chamber,
  exposing the substrate to a sixth process gas in the sixth process region for a third exposure time, the sixth process gas comprising a plasma;

depositing additional second spacer film by repeating a fourth PE ALD process to form a an integrated second spacer film having a total thickness in the range of about 10 nm to about 50 nm, the fourth PE ALD process comprising,
  exposing the substrate to a seventh process gas in a seventh processing region, the seventh process gas comprising a silicon precursor,
  laterally moving the substrate through a gas curtain to an eighth process region in the processing chamber,
  exposing the substrate to an eighth process gas in the eighth process region for a fourth exposure time, the eighth process gas comprising a plasma, the fourth exposure time being shorter than the third exposure time;

etching the integrated second spacer film to remove substantially all of the integrated second spacer film from the top of the first features without removing substantially any of the integrated second spacer film from the sidewalls of the first features;

removing the first features to expose a second substrate and leave the integrated second spacer film on the substrate; and etching the exposed second substrate to form adjacent pairs of second features comprising the second substrate material, the adjacent pairs of second features having adjacent critical dimension and pair critical dimension.

* * * * *